(12) United States Patent
Chang et al.

(10) Patent No.: US 6,884,719 B2
(45) Date of Patent: Apr. 26, 2005

(54) METHOD FOR DEPOSITING A COATING HAVING A RELATIVELY HIGH DIELECTRIC CONSTANT ONTO A SUBSTRATE

(75) Inventors: Jane Chang, Los Angeles, CA (US); You-Sheng Lin, Downey, CA (US); Avishai Kepten, D.N. Bikaht Beit Cerem (IL); Michael Sendler, Boise, ID (US); Sagy Levy, Sunnyvale, CA (US); Robin Bloom, Petaluma, CA (US)

(73) Assignees: Mattson Technology, Inc., Fremont, CA (US); The Regents of the University of California, Oakland, CA (US)

(*) Notice: Subject to any disclaimer, the term of this patent is extended or adjusted under 35 U.S.C. 154(b) by 0 days.

(21) Appl. No.: 10/101,539

(22) Filed: Mar. 19, 2002

(65) Prior Publication Data

US 2003/0031793 A1 Feb. 13, 2003

Related U.S. Application Data

(60) Provisional application No. 60/277,326, filed on Mar. 20, 2001.

(51) Int. Cl.[7] .................. H01L 21/31; H01L 21/469
(52) U.S. Cl. .................. 438/681; 438/680; 438/785; 427/585
(58) Field of Search .................. 438/680, 681, 438/758, 785; 427/585

(56) References Cited

U.S. PATENT DOCUMENTS

| | | |
|---|---|---|
| 4,058,430 A | 11/1977 | Suntola et al. |
| 4,413,022 A | 11/1983 | Suntola et al. |
| 4,798,165 A | 1/1989 | deBoer et al. |

(Continued)

OTHER PUBLICATIONS

PCT Search Report, Jul. 31, 2002.

"SiON/Ta2O5/TiN Gate Stack Transistor with 1.8nm Equivalent $SiO_2$ Thickness," D. Park, Q. Lu, T. J. King, C. Hu, A. Kalanitski, S. P. Tay, C. C. Cheng, Tech. Dig. Int. Electron Device Meet., p. 381, 1998.

"Ultra Thin High Quality $Ta_2O_5$ Gate Dielectric Prepared By In-situ Rapid Thermal Processing," H. F. Laun, B.Z. Wu, L. G. Kang, B. Y. Kim, R. Vrtis, D. Roberts, and D. L. Kwong, Tech, Dig, Int, Electron Device, Meet., 1999, 4 pages.

"Hafnium and Zirconium Silicates for Advanced Gate Dielectrics," G. D. Wilk, R. M. Wallace, and J. M. Anthony, Journal of Applied Physics, vol. 87(1), pp. 484–492, 2000.

"Stable Zirconium Silicate Gate Dielectrics Deposited Directly on Silicon," G. D. Wilk and R. M. Wallace, Applied Physics Letters, 76(1), pp. 112–114, 1999.

"Model to Stimulate Parabolic Followed by Linear Oxidation Kinetics," Alicia Denis and Eduardo A. Garcia, Oxidation of Metals, pp. 153–167, 1988.

*Primary Examiner*—Alexander Ghyka
(74) *Attorney, Agent, or Firm*—Dority & Manning, P.A.

(57) ABSTRACT

A method for depositing a high-k dielectric coating onto a substrate, such as a semiconductor wafer, is provided. The substrate is subjected to one or more reaction cycles. For instance, in a typical reaction cycle, the substrate is heated to a certain deposition temperature. Thereafter, in one embodiment, one or more reactive organo-metallic gas precursors are supplied to the reactor vessel. An oxidizing gas is also supplied to the substrate at a certain oxidizing temperature to oxidize and/or densify the layers. As a result, a metal oxide coating is formed that has a thickness equal to at least about one monolayer, and in some instances, two or more monolayers. The dielectric constant of the resulting metal oxide coating is often greater than about 4, and in some instance, is from about 10 to about 80.

43 Claims, 7 Drawing Sheets

U.S. PATENT DOCUMENTS

| | | | |
|---|---|---|---|
| 5,006,363 A * | 4/1991 | Fujii et al. .................... 427/39 |
| 5,294,568 A | 3/1994 | McNeilly et al. |
| 5,493,987 A | 2/1996 | McDiarmid et al. |
| 5,648,321 A | 7/1997 | Bednorz et al. |
| 5,773,078 A | 6/1998 | Skelly |
| 5,786,248 A | 7/1998 | Schuegraf |
| 5,830,277 A | 11/1998 | Johnsgard et al. |
| 5,856,242 A * | 1/1999 | Arai et al. ................. 438/770 |
| 5,916,365 A | 6/1999 | Sherman |
| 5,964,949 A | 10/1999 | Savas |
| 5,968,279 A | 10/1999 | MacLeish et al. |
| 5,972,430 A | 10/1999 | DiMeo, Jr. et al. |
| 6,013,553 A | 1/2000 | Wallace et al. |
| 6,015,590 A | 1/2000 | Suntola et al. |
| 6,037,235 A | 3/2000 | Narwankar et al. |
| 6,118,100 A | 9/2000 | Mailho et al. |
| 6,133,550 A | 10/2000 | Griffiths et al. |
| 6,136,725 A | 10/2000 | Loan et al. |
| 6,150,209 A | 11/2000 | Sun et al. |
| 6,174,809 B1 | 1/2001 | Kang et al. |
| 6,177,341 B1 | 1/2001 | Lai |
| 6,198,074 B1 | 3/2001 | Savas |
| 6,200,634 B1 | 3/2001 | Johnsgard et al. |
| 6,203,613 B1 | 3/2001 | Gates et al. |
| 6,207,583 B1 | 3/2001 | Dunne et al. |
| 6,301,434 B1 | 10/2001 | McDiarmid et al. |
| 6,303,520 B1 | 10/2001 | Kwong et al. |
| 6,303,524 B1 | 10/2001 | Sharangpani et al. |
| 6,331,697 B1 | 12/2001 | Savas |
| 6,342,691 B1 | 1/2002 | Johnsgard et al. |
| 6,342,777 B1 | 1/2002 | Takahashi |
| 6,355,909 B1 | 3/2002 | Griffiths et al. |
| 6,420,279 B1 * | 7/2002 | Ono et al. .................. 438/785 |
| 6,436,796 B1 | 8/2002 | Mailho et al. |
| 6,449,428 B1 | 9/2002 | Aschner et al. |
| 6,451,713 B1 | 9/2002 | Tay et al. |
| 6,540,838 B1 | 4/2003 | Sneh et al. |

OTHER PUBLICATIONS

"Atomic Layer Chemical Vapor Deposition of $TiO_2$ Low Temperature Epitaxy of Rutile and Anatase," Mikael Schuisky, Andres Hårsta, Aleks Aidla, Kaupo Kukli, Alma–Asta Kiisler, and Jaan Aarik, Journal of The Electrochemical Society, vol. 147(9), pp. 3319–3325, 2000.

U.S. patent application Ser. No. 10/413,507, Selbrede et al., filed Apr. 14, 2003, System For Depositing a Thin Film Onto a Substrate Using a Low Pressure Gas Precursor.

* cited by examiner

METHOD FOR DEPOSITING A COATING HAVING A RELATIVELY HIGH DIELECTRIC CONSTANT ONTO A SUBSTRATE

RELATED APPLICATIONS

The present application claims priority to a provisional application filed on Mar. 20, 2001 having Ser. No. 60/277,326.

BACKGROUND OF THE INVENTION

For forming MOSFET (Metal Oxide Semiconductor Field Effect Transistor) devices or high memory devices, such as DRAMs (Dynamic Random Access Memories), it is often necessary to form a thin, high dielectric constant (high-k) coating onto a substrate, such as a silicon wafer. For example, the thickness of such coatings is often less than 30 nanometers. To form such a thin dielectric coating on a substrate, a variety of deposition techniques have been developed.

For example, chemical vapor deposition (CVD) has traditionally been used to form a high-k coating on a substrate. Chemical vapor deposition typically involves supplying a gas precursor and oxidizing gas to a vessel. The precursors decompose and react with the oxidizing gas on the surface of the substrate to form the oxide coating. However, chemical vapor deposition generally results in relatively thick layers that have a number of defects, which can limit the performance of the resulting electronic devices. Thus, after the high-k coating is formed, it is usually then exposed to an annealing gas so that oxygen can penetrate into the coating to eliminate the defects at the interface of the coating and the substrate and in the bulk of the coating. In many cases, relatively high temperatures are required to allow the oxidizing gas to diffuse through the coating in the manner described above.

However, such high temperatures can sometimes cause unwanted crystallization of the coating, further increasing the leakage current through the grain boundaries, which can adversely degrade with the overall performance of the electrical device.

Thus, in view of these problems, another method known as "atomic layer deposition" has been developed for depositing a high-k coating onto a substrate. Atomic layer deposition involves the sequential cycling of reactive chemistries to the wafer substrate to form thin film layers. Specifically, each reaction cycle is conducted at the same deposition and surface reactivation conditions so that only one monolayer is formed per reaction cycle. For example, atomic layer deposition generally involves supplying a gas precursor (e.g., inorganic metal halides) to provide a single monolayer. Thereafter, a second gas, such as water, is supplied to fully oxidize the gas precursor and form a metal oxide film on the wafer substrate. Additional cycles are utilized to form additional monolayers until the desired coating is formed. Thereafter, an annealing gas is supplied to remove defects from the coating. For instance, as shown in FIG. 4A, a coating formed according to a conventional "atomic layer deposition" technique is illustrated. Other examples of such conventional atomic layer deposition techniques are described in U.S. Pat. Nos. 4,058,430 and 4,413,022 to Suntola.

Although atomic layer deposition has some benefits over prior methods, it also possesses a variety of problems. For example, atomic layer deposition provides for very little processing control and, as a result, certain target characteristics of the dielectric coating may not be readily achieved. In addition, because atomic layer deposition is limited to one monolayer per reaction cycle, its effectiveness in a production environment may be limited.

As such, a need currently exists for an improved method of depositing a high-k coating onto a substrate.

SUMMARY OF THE INVENTION

In accordance with one embodiment of the present invention, a method for depositing a dielectric coating onto a substrate (e.g., semiconductor wafer) is provided that includes a system comprising a reactor vessel adapted to contain the substrate and an energy source in communication with the reactor vessel for heating the substrate. While in the reactor vessel, the substrate can be subjected to one or multiple (e.g., at least two) reaction cycles. For example, one reaction cycle can include the following:

a) heating the substrate to a first deposition temperature with the energy source, wherein the first deposition temperature is greater than about 300° C.;

b) supplying to the reactor vessel a first gas precursor for a first deposition time period while the substrate is at the first deposition temperature, the first gas precursor having a first gas precursor flow rate, the first gas precursor comprising an organo-metallic compound;

c) supplying to the reactor vessel a first oxidizing gas for a first oxidizing gas time period while the substrate is at a first oxidizing gas temperature, the first oxidizing gas having a first oxidizing gas flow rate.

As a result, at least a partial monolayer of a dielectric is formed during the reaction cycle, and in some instances, at least a monolayer. For example, the dielectric can contain a metal oxide that includes, but not limited to, aluminum oxide ($Al_2O_3$), tantalum oxide ($Ta_2O_5$), titanium oxide ($TiO_2$), zirconium oxide ($ZrO_2$), hafnium oxide ($HfO_2$), yttrium oxide ($Y_2O_3$), combinations thereof, and the like. In addition, the dielectric coating can also contain a metal silicate, such as hafnium silicate or zirconium silicate.

Moreover, the method for depositing a dielectric coating onto the substrate can further comprise:

subjecting the substrate to a second reaction cycle, the second reaction cycle comprising:

a) supplying to the reactor vessel a second gas precursor for a second deposition time period while the substrate is at a second deposition temperature, the second deposition temperature being greater than about 300° C., the second gas precursor having a second gas precursor flow rate;

b) supplying to the reactor vessel a second oxidizing gas for a second oxidizing gas time period while the substrate is at a second oxidizing gas temperature, the second oxidizing gas having a second oxidizing gas flow rate.

The method can further include controlling the first reaction cycle and the second reaction cycle such that the first deposition temperature is different than the second deposition temperature, the first gas precursor flow rate is different than the second gas precursor flow rate, the first deposition time period is different than the second deposition time period, the first oxidizing gas temperature is different than the second oxidizing gas temperature, the first oxidizing gas flow rate is different than the second oxidizing gas flow rate, the first oxidizing gas time period is different than the second oxidizing gas time period, or combinations thereof. In alternative embodiments, however, each of the aforementioned parameters remains substantially the same in each reaction cycle.

In accordance with another embodiment of the present invention, a method for depositing a dielectric coating is disclosed. The method comprises:

i) providing a system comprising a reactor vessel adapted to contain the semiconductor wafer and an energy source in communication with the reactor vessel for heating the semiconductor wafer contained in the vessel; and ii) subjecting the semiconductor wafer to a first reaction cycle, the first reaction cycle comprising:

a) heating the semiconductor wafer to a first deposition temperature with the energy source, wherein the first deposition temperature is greater than about 300° C.;

b) supplying to the reactor vessel a first gas precursor for a first deposition time period while the semiconductor wafer is at the first deposition temperature, the first gas precursor having a first gas precursor flow rate;

c) supplying to the reactor vessel a first oxidizing gas for a first oxidizing gas time period while the semiconductor wafer is at a first oxidizing temperature, the first oxidizing gas having a first oxidizing gas flow rate, wherein at least a partial monolayer of a dielectric is formed during the first reaction cycle; and iii) subjecting the semiconductor wafer to a second reaction cycle, the second reaction cycle comprising:

a) supplying to the reactor vessel a second gas precursor for a second deposition time period while the semiconductor wafer is at a second deposition temperature, the second deposition temperature being greater than about 300° C., the second gas precursor having a second gas precursor flow rate;

b) supplying to the reactor vessel a second oxidizing gas for a second oxidizing gas time period while the semiconductor wafer is at a second oxidizing gas temperature, the second oxidizing gas having a second oxidizing gas flow rate, wherein at least a partial monolayer of a dielectric is formed during the second reaction cycle; and iv) subjecting the semiconductor wafer to one or more additional reaction cycles to achieve a target thickness. In this embodiment, the first gas precursor, the second gas precursor, or combinations thereof comprise an organo-silicon compound so that the resulting dielectric coating contains a metal silicate.

Other features and aspects of the present invention are discussed in greater detail below.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures in which:

FIG. 4 is a graphical depiction of various reaction cycles, in which FIG. 4A illustrates the deposition of chemicals "a" and "e" utilizing conventional atomic layer deposition techniques and FIG. 4B illustrates the deposition of chemicals "a" and "e" in accordance with one embodiment of the present invention;

FIG. 5 is a graphical illustration of one embodiment of the present invention, in which FIG. 6 is an illustration of one embodiment of the present invention in which

Figure 1:
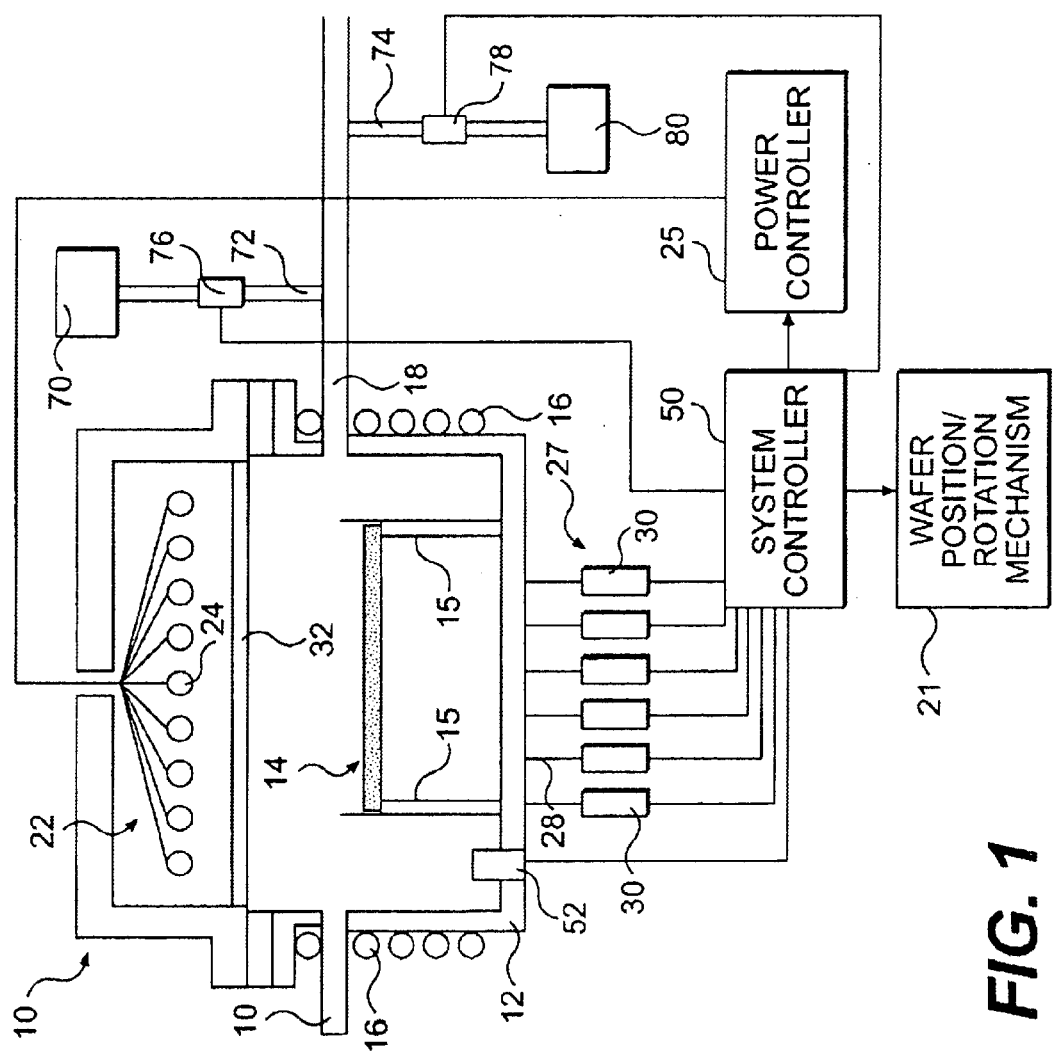
FIG. 1 is a cross-sectional view of a rapid thermal chemical vapor deposition system that can be utilized in one embodiment of the present invention.

Repeat use of reference characters in the present specification and drawings is intended to represent same or analogous features or elements of the invention.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present invention, which broader aspects are embodied in the exemplary construction.

The present invention is generally directed to a method of depositing a coating having a relatively high dielectric constant "k" onto a substrate. For instance, the dielectric constant of the coating formed according to the present invention is typically greater than about 4, in some embodiments greater than about 8, in some embodiments greater than about 10, and in some embodiments, greater than about 15. For instance, coatings formed according to the present invention might have a dielectric constant between about 5 to about 100, and in some embodiments, between about 15 to about 20. Further, the resulting high-k coating can generally have a thickness less than about 30 nanometers. For instance, when forming logic devices, such as MOSFET devices, the resulting thickness is typically between about 1 to about 8 nanometers, and in some embodiments, between about 1 to about 2 nanometers. Moreover, when forming memory devices, such as DRAMs, the resulting thickness is typically between about 2 to about 30 nanometers, and in some embodiments, between about 5 to about 10 nanometers.

In some embodiments, the method of the present invention can be used to deposit a high-k dielectric coating that contains a metal oxide in which the metal is aluminum, hafnium, tantalum, titanium, zirconium, yttrium, silicon, combinations thereof, and the like. For instance, the method of the present invention can be utilized to deposit a thin coating of a metal oxide, such as aluminum oxide ($Al_2O_3$), tantalum oxide ($Ta_2O_5$), titanium oxide ($TiO_2$), zirconium oxide ($ZrO_2$), hafnium oxide ($HfO_2$), yttrium oxide ($Y_2O_3$), and the like, onto a semiconductor wafer made from silicon. Tantalum oxide, for example, typically forms a coating having a dielectric constant between about 15 to about 30. Likewise, the dielectric coating can also contain a metal silicate compound, such as zirconium silicate ($SiZrO_4$), hafnium silicate ($SiHfO_4$), and the like.

To deposit the relatively high-k coating, the substrate can be subjected to various reaction cycles. For instance, in a typical reaction cycle, the wafer substrate is heated to a certain deposition temperature (e.g., greater than about 300° C.). Thereafter, one or more reactive gas precursors are supplied to the reactor vessel. To fully oxidize and/or anneal (i.e., density) the deposited layers, an oxidizing gas can then be supplied to the vessel at a certain oxidizing temperature, which may be the same or different than the deposition temperature. Additional reaction cycles can then be utilized to deposit other layer(s) onto the substrate to achieve a coating with a desired thickness. As a result, a dielectric coating can be formed in a reaction cycle that has a thickness equal to at least a partial monolayer, and in some instances, at least one monolayer.

Various parameters of the process described above can be carefully controlled such that the characteristics of the resulting coating are optimized. For example, the deposition temperature, oxidizing temperature, and/or the flow rate of the gas precursor and/or oxidizing gas can be controlled in each cycle so that the deposited coating is fully oxidized and has relatively low defect density. As will be described in more detail below, the method of the present invention can provide a variety of improvements over conventional deposition techniques. For example, in contrast to conventional techniques, the method of the present invention can be used to form multiple oxide layers in a single reaction cycle. In particular, multiple layers can form in part due to the higher deposition and/or oxidizing temperatures utilized. Moreover, the layers formed in accordance with the present invention can be both fully oxidized and/or annealed in incremental steps, i.e., between deposition of gas precursors in different reaction cycles. Further, because such oxidizing and/or annealing occurs incrementally during deposition, the requirement of a separate annealing step after complete deposition can be virtually eliminated. As a result of these and other improvements, the present inventors have discovered that high-k dielectric coatings can be formed to have less defects, reduced leakage current, with higher throughput, and be more uniform than conventionally formed coatings.

In general, any chamber or vessel that is capable of being utilized to deposit a dielectric coating onto a substrate can be utilized in the present invention. For example, conventional chemical vapor deposition vessels can be adapted for use with the method of the present invention. It should be understood, however, that other vessels used in other techniques can also be used in the present invention, such as vessels utilized in physical vapor deposition, plasma enhanced chemical vapor deposition, sputtering, and the like.

In this regard, referring to FIG. 1, one particular embodiment of a system 10 that utilizes chemical vapor deposition to deposit the dielectric coating onto a substrate is illustrated. As shown, the system 10 includes a reactor vessel 12 adapted to receive substrates, such as a semiconductor wafer 14. As shown, the wafer 14 is positioned on a substrate holder 15 made from a thermal insulating material, such as quartz. During processing, the substrate holder 15, in one embodiment, can be adapted to rotate the wafer 14 using a wafer rotation mechanism. Rotating the wafer 14 may promote better temperature uniformity over the surface of the wafer 14 and may promote enhanced contact and gas uniformity between the wafer 14 and gases introduced into the reactor vessel 12. It should be understood, however, that besides wafers, the reactor vessel 12 is also adapted to process other substrates, such as optical parts, films, fibers, ribbons, etc.

The reactor vessel 12 is designed to heat the wafer 14 at very rapid rates and under carefully controlled conditions. The reactor vessel 12 can be made from various materials, including, for example, metals and ceramics. For instance, in some embodiments, the reactor vessel 12 can be made from stainless steel or quartz. When the reactor vessel 12 is made from a heat conductive material, it typically includes a cooling system. For instance, as shown in FIG. 1, the reactor vessel 12 includes a cooling conduit 16 wrapped around the perimeter of the reactor vessel 12 or contained within holes of the reactor vessel 12.

As shown, an energy source 22 is also provided in the apparatus 10. In particular, the energy source 22 is placed into communication with the reactor vessel 12 for emitting energy to heat the wafer 14 during processing. In general, a variety of heating devices can be utilized as the energy source 22. For example, the energy source 22 can contain lights, lasers (e.g., a nitrogen laser), ultraviolet radiation heating devices, arc lamps, flash lamps, infrared radiation devices, combinations thereof, and the like. Moreover, the spectral shape and/or certain properties (e.g., intensity, polarization, continuous and/or pulsed emission radiation) of the energy source 22 can be varied to adapt to a particular process. For instance, the spectral shape of the energy source 22 can be controlled as a function of time and/or as a function of a property of the wafer 14 or film(s) on the wafer 14 (e.g., temperature of the film(s) and/or the wafer 14, the thickness of a film being deposited on the wafer 14, or any other physical or chemical parameter of the film(s) or the wafer 14).

In the illustrated embodiment, for example, the energy source 22 includes a plurality of lamps 24. The lamps 24 can be incandescent lamps, such as tungsten-halogen lamps. The energy source 22 can also include a reflector or a set of reflectors for uniformly directing energy being emitted by the lamps 24 onto the wafer 14. As shown in FIG. 1, the lamps 24 are placed above the wafer 14. It should be understood, however, that the lamps 24 may be placed at any particular location. For example, lamps may be utilized above and/or below the wafer 14. Further, additional or less lamps can be included within the system 10 if desired.

The system 10 can also include a window 32 positioned between the energy source 22 and the wafer 14 that is capable of allowing energy at a preselected wavelength to pass therethrough. For example, the window 32 can, in some embodiments, act as a filter by allowing certain wavelengths of light to pass therethrough, while absorbing other wavelength(s). In addition, the window 32, in some embodiments, may not act as a filter. For example, in one embodiment, a transparent window 32 can be utilized to allow a laser, such as a nitrogen laser that emits light at a wavelength of 337 nanometers, to be emitted from the energy source 22 onto the wafer 14. In this embodiment, the window 32 need not act as a filter.

In order to monitor the temperature of the wafer 14 during a heating cycle, the reactor vessel 12 can, in one embodiment, includes a plurality of radiation sensing devices 27. The radiation sensing devices 27 can include, for example, a plurality of optical fibers, lenses, light pipes, etc. For example, in the illustrated embodiment, the radiation sensing devices include light pipes 28 that are in communication with a plurality of corresponding temperature detectors 30. In one embodiment, for example, the optical fibers 28 are configured to receive thermal energy being emitted by the wafer 14 at a particular wavelength. The amount of sensed radiation is then communicated to temperature detectors 30, which generate a usable voltage signal for determining the temperature of the wafer which can be calculated based, in part, on Planck's Law. In one embodiment, each optical fiber 28 in combination with a temperature detector 30 comprises a pyrometer. In another embodiment, the optical fibers 28 are routed to a single but multiplexing radiation sensing device.

Besides using radiation sensing devices, other temperature sensing devices may also be used in the system of the present invention. For instance, one or more thermocouples may be incorporated into the system for monitoring the temperature of the wafer 14 at a single location or at a plurality of locations. The thermocouples can be placed in direct contact with the wafer 14 or can be placed adjacent the wafer 14 from which the temperature can be extrapolated.

The reactor vessel 12 also includes at least one an inlet 18 for introducing one or more liquid precursors or gases into the vessel to form the dielectric coating on the wafer 14. For example, as shown, the inlet 18 can be in communication with a gas supply 70 via a line 72 and a gas supply 80 via a line 74 for providing two separate gases to the reactive vessel 12. The reactor vessel 12 also includes at least one outlet 20 for evacuating gases from the vessel 12 after a certain period of time. For example, as described in more detail below, a gas precursor and oxidizing gas can be introduced into the reactor vessel 12 through the inlet 18 for forming a coating on the wafer 14. It should also be understood that, although only one inlet 18 and outlet 20 are illustrated, the vessel 12 may contain any number of inlets and outlets for supplying the vessel with gases or liquids.

In accordance with one embodiment of the present invention, one or more gases are supplied to the reactor vessel 12 to form a dielectric coating on the wafer 14. The dielectric coating can be formed directly on the wafer 14 or on a barrier layer, such as a silicon nitride layer, previously formed on the wafer 14. In this regard, one embodiment of the method of the present invention for forming a dielectric coating on the wafer 14 using the chemical vapor deposition system shown in FIG. 1 will now be described in more detail. It should be understood, however, that other systems and other deposition techniques can also be used in the method of the present invention. For example, one suitable chemical vapor deposition system may be described in U.S. Pat. No. 6,136,725 to Loan, et al., which is incorporated herein in its entirety by reference thereto for all purposes.

As shown, a reaction cycle is initiated by first heating the wafer 14 to a certain deposition temperature using the energy source 22. The particular deposition temperature for a given reaction cycle can generally vary based on the substrate utilized, the reactive gases utilized, and/or the desired characteristics of the deposited coating, as will be explained in more detail below.

In accordance with the present invention, the deposition temperature generally has a relatively high value so that multiple high-k layers can be formed on the substrate if desired. For example, it is typically desired that the deposition temperature utilized in the present invention be greater than the deposition temperatures utilized in conventional atomic layer deposition techniques. In particular, when depositing a high-k dielectric layer onto a silicon wafer, the deposition temperature of the wafer is typically maintained at greater than about 300° C., in some embodiments greater than about 350° C., and in some embodiments, greater than about 500° C. For instance, although the deposition temperature will generally vary based on the gas precursor(s) utilized, it is typically from about 300° C. to about 900° C., and in some embodiments, from about 500° C. to about 900° C. Moreover, the reactor vessel pressure during deposition is typically from about $10^{-7}$ Torr to about 100 Torr.

While the wafer 14 is maintained at the deposition temperature, a gas precursor is supplied to the reactor vessel 12 via the inlet 18 for a certain deposition time period and at a certain flow rate. For example, as shown in FIG. 1, one or more gas precursors can be supplied to the gas inlet 18 from a gas supply 70 via line 72. The gas precursor flow rates can vary, but are typically from about 1 standard cubic centimeter per minute to about 1 liter per minute. The gas precursor(s) can be supplied to the reactor vessel 12 either alone or in conjunction with a carrier gas, such as an inert gas (e.g., argon). Other suitable inert gases are described in U.S. Pat. No. 5,972,430 to DiMeo, Jr., which is incorporated herein in its entirety by reference thereto for all purposes.

In general, a variety of gas precursors can be utilized in the present invention to form a coating having a high dielectric constant "k". In particular, any gas precursor that is capable of forming a high-k coating on the wafer can be utilized in the present invention. For example, some suitable gas precursors include gases that contain aluminum, hafnium, tantalum, titanium, silicon, yttrium, zirconium, combinations thereof, and the like.

In some instances, the vapor of an organo-metallic compound can be used as the precursor. Some examples of such organo-metallic gas precursors include, but are not limited to, tri-i-butylaluminum, aluminum ethoxide, aluminum acetylacetonate, hafnium (IV) t-butoxide, hafnium (IV) ethoxide, tetrabutoxysilane, tetraethoxysilane, pentakis (dimethylamino)tantalum, tantalum ethoxide, tantalum methoxide, tantalum tetraethoxyacetylacetonate, tetrakis (diethylamino)titanium, titanium t-butoxide, titanium ethoxide, tris(2,2,6,6-tetramethyl-3,5-heptanedionato) titanium, tris[N,N-bis(trimethylsilyl)amide]yttrium, tris(2,2, 6,6-tetramethyl-3,5-heptanedionato)yttrium, tetrakis (diethylamino)zirconium, zirconium t-butoxide, tetrakis(2, 2,6,6-tetramethyl-3,5-heptanedionato)zirconium, bis (cyclopentadienyl)dimethylzirconium, and the like.

When utilized in accordance with the present invention, an organo-metallic precursor, such as described above, can form a partial monolayer, a monolayer, or multiple monolayers (partial or full) on the wafer substrate. Thus, in contrast to conventional CVD techniques in which an inorganic metallic gas precursor reacts with an oxidizing gas to form the dielectric coating, the method of the present invention can beneficially form layers without having to react on the surface of the substrate with an oxidizing gas. It should be understood, however, that inorganic metallic gas precursors may be utilized in conjunction with organic metallic precursors in the present invention. For example, in one embodiment, an organic metallic precursor (e.g., organo-silicon compound) is used during a first reaction cycle, while an inorganic metallic precursor (e.g., silicon-containing inorganic compound) is used during a second reaction cycle, or vice-versa.

During formation of the layer(s) in the method of the present invention, the organo-metallic gas precursor may sometimes generate undesired hydrocarbons on the substrate. Therefore, in some instances, one or more oxidizing gases can be provided to reduce the hydrocarbon defects from the layer(s). For example, as shown in FIG. 1, after the desired deposition time period, the gas precursor(s) can be removed from the reactor vessel 12 via an outlet 20 using a pump (not shown). One or more inert gases may also be utilized to purge the gas precursor(s). An oxidizing gas may then be supplied to the reactor vessel 12 via the inlet 18 for a certain oxidation time period and at a certain flow rate. For example, as shown in FIG. 1, one or more oxidizing gases can be supplied to the gas inlet 18 from a gas supply 80 via line 74. The oxidizing gas flow rates can vary, but are typically between about 1 standard cubic centimeter per minute to about 1 standard liter per minute. In general, any of a variety of gases that are capable of oxidizing a metal can be utilized in the present invention. For example, some suitable oxidizing gases include, but are not limited to oxygen, nitric oxide ($NO_2$), nitrous oxide ($N_2O$), steam, combinations thereof, and the like.

During the oxidation gas time period, the wafer 14 is typically heated by the energy source 22 to an oxidizing gas temperature to oxidize and/or densify the oxide coating in such a manner to limit defects formed therein. The oxidizing gas temperature may be the same or different than the deposition temperature. In fact, the particular oxidizing gas temperature for a given reaction cycle can vary based on the substrate utilized, the gases utilized, and/or the desired characteristics of the deposited coating. For example, the oxidizing gas temperature utilized when depositing a high-k dielectric coating onto a silicon wafer is typically greater than about 300° C., in some embodiments greater than 500° C., in some embodiments between about 400° C. to about 900° C., and in some embodiments, between about 500° C. to about 900° C. Moreover, the reactor vessel pressure during oxidizing is typically between about $10^{-7}$ Torr to about 100 Torr.

As a result of a reaction cycle, such as described above, one or multiple layers of a high-k oxide material can form near the interface with the wafer 14 and thus, are referred to herein as "interfacial" layer(s). As noted above, additional layers can also be formed on these interfacial layer(s) by utilizing one or more additional reaction cycles. These additional layer(s) are referred to herein as "bulk" layers. It should be understood that only the first layer formed on the wafer 14 is necessarily referred to as an "interfacial layer", and only the last layer formed on the wafer 14 is necessarily referred to as a "bulk layer". Specifically, the layers formed between the first and last layer may be referred to as either bulk or interfacial layers.

Figure 2:
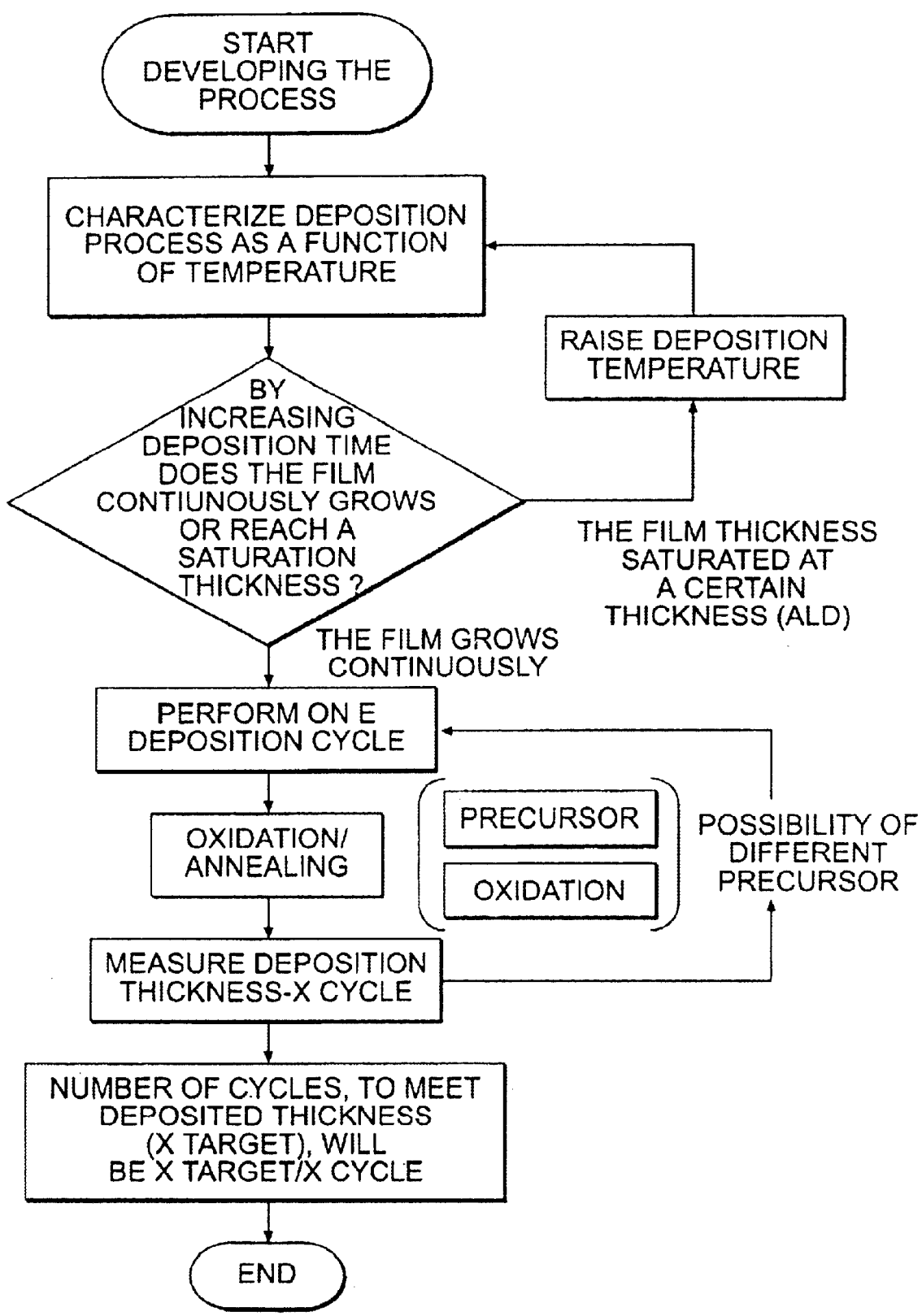
FIG. 2 is a flow diagram of a method for determining the number of reaction cycles required in accordance with one embodiment of the present invention.

As stated above, additional reaction cycles may be performed to achieve a desired coating thickness. Referring to FIG. 2, for example, one embodiment of a method for determining the number of reaction cycles necessary for a given process is illustrated. For instance, as shown, a metal oxide deposition curve is first developed at a given deposition temperature for the desired coating in accordance with standard industry techniques. During processing, the development of the layer is observed as a function of the deposition time to determine whether the layer continuously grows or reaches a saturation thickness. If a saturation thickness is attained, the deposition temperature is increased and a new growth curve is developed at the raised temperature. This process is repeated until the layer is observed to continuously grow upon an increase of the deposition time. At this point, one reaction cycle is performed, such as described above, at a prescribed temperature, and the thickness of the deposited layer is determined. The measured thickness is then compared to a predetermined target thickness. The number of additional reaction cycles required is equal to the predetermined target thickness divided by the measured thickness.

The deposition process may be carried out in either the saturation regime or in the continuously growth regime. The morphology and film properties of the deposited films would vary due to the different surface reaction mechanisms involved.

In accordance with the present invention, various parameters of the method described above may be controlled in order to produce a dielectric coating having certain preselected characteristics. For example, the gas precursor and oxidizing gases used in the reaction cycles may be selected to be the same or different. Moreover, in one embodiment, the "deposition conditions" (i.e., conditions for the time period in which the gas precursor is allowed to contact the substrate) of one or more the reaction cycles can be controlled. In some embodiments, for instance, it may be desired to utilize a certain preselected deposition temperature profile, gas precursor vapor pressure profile, deposition time period profile, and/or gas precursor flow rate profile so that one reaction cycle operates at one set of deposition conditions, while another reaction cycle operates at another set of deposition conditions.

Figure 3:
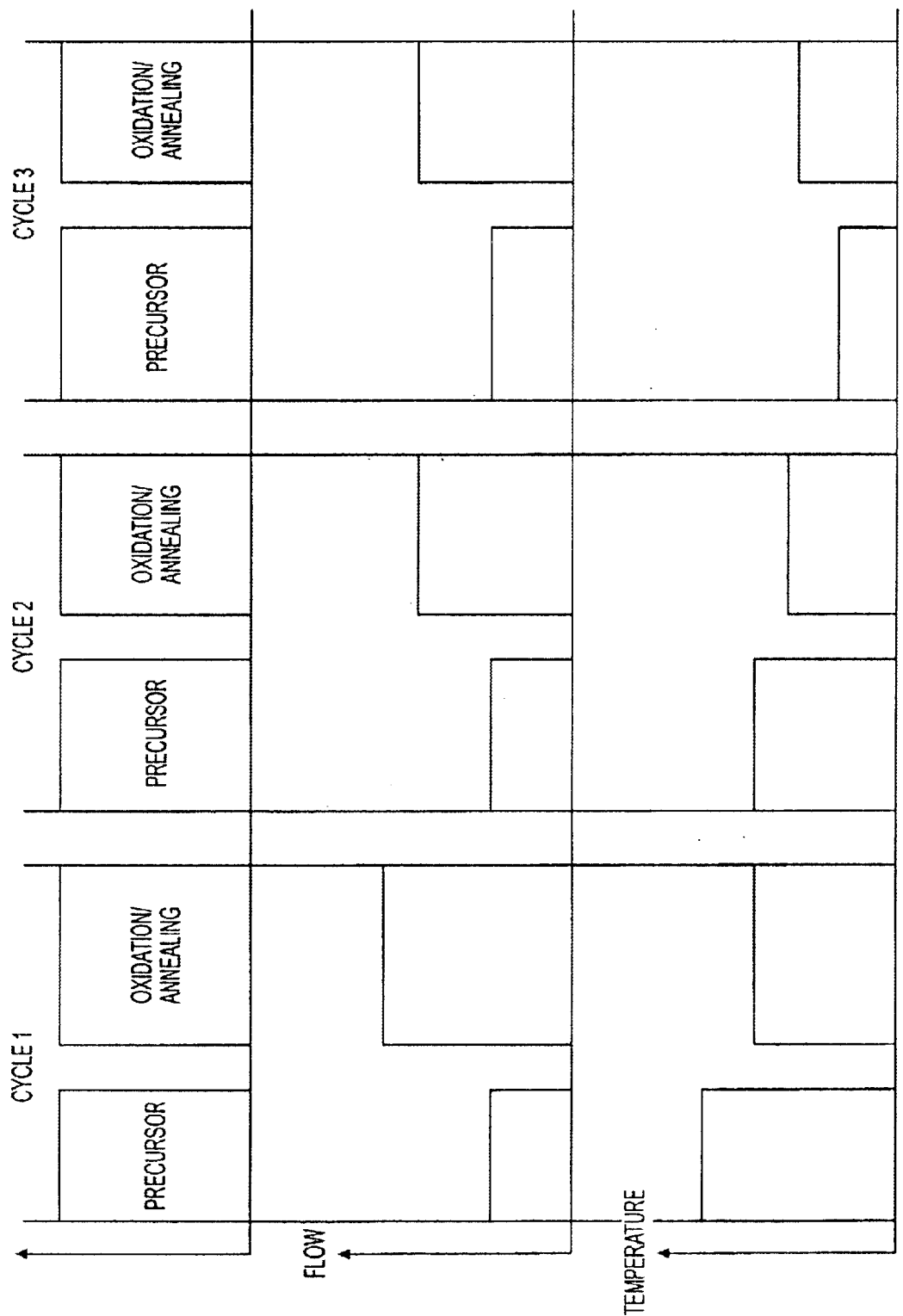
FIG. 3 is a graphical depiction of the temperature, flow rate, and time period profiles for three reaction cycles in accordance with one embodiment of the present invention.

Referring to FIG. 3, one embodiment of a profile of one set of deposition conditions that can be used in the present invention is illustrated. In particular, the embodiment depicted in FIG. 3 represents a process that utilizes three reaction cycles. As shown, the deposition temperature decreases for each cycle, while the gas precursor flow rate remains the same for all three reaction cycles. For example, in one embodiment, the deposition temperature for the first cycle is about 500° C., and decreases thereafter. Moreover, in the embodiment shown in FIG. 3, the precursor deposition time period for the first reaction cycle is slightly less than the deposition time period for the remaining two reaction cycles. As a result, the initial interfacial layers formed in the first cycle may be slightly thinner than the layers formed in the other cycles, which may, in some instances, improve the quality of the interfacial layers and enhance the electrical properties of the resulting coating.

In addition to controlling the deposition conditions of one or more of the reaction cycles, the "oxidizing gas conditions" (i.e., conditions for the time period in which the oxidizing gas is allowed to contact the substrate) of one or more the reaction cycles can also be controlled. In some embodiments, for instance, it may be desired to utilize a certain preselected oxidizing gas temperature profile, oxidizing gas vapor pressure profile, oxidizing gas time period profile, and/or oxidizing gas flow rate profile so that one reaction cycle operates at one set of oxidizing conditions, while another reaction cycle operates at another set of oxidizing/annealing conditions.

Referring to FIG. 3, one embodiment of a profile of the oxidizing conditions that can be used in the present invention is illustrated. As shown, the oxidizing gas time period and temperature decreases for all three reaction cycles. In addition, the oxidizing gas flow rate is relatively high for the first reaction cycle for a longer period of time, but is decreased for the second and third reaction cycles for a shorter period of time.

Such a profile for the oxidizing gas conditions can provide a variety of beneficial results to the metal oxide coating. In particular, by utilizing a relatively high oxidizing gas temperature and oxidizing gas flow rate in the first reaction cycle, the resulting interfacial layer(s) can be provided with a relatively high concentration of oxygen. This elevated oxygen concentration can reduce unwanted dangling bonds between the metal oxide (e.g., aluminum oxide, hafnium oxide, tantalum oxide, titanium oxide, zirconium oxide, yttrium oxide, silicon oxide, etc.) and the wafer (e.g., silicon), which are commonly referred to as "defects" and cause "leakage current".

Figure 4:
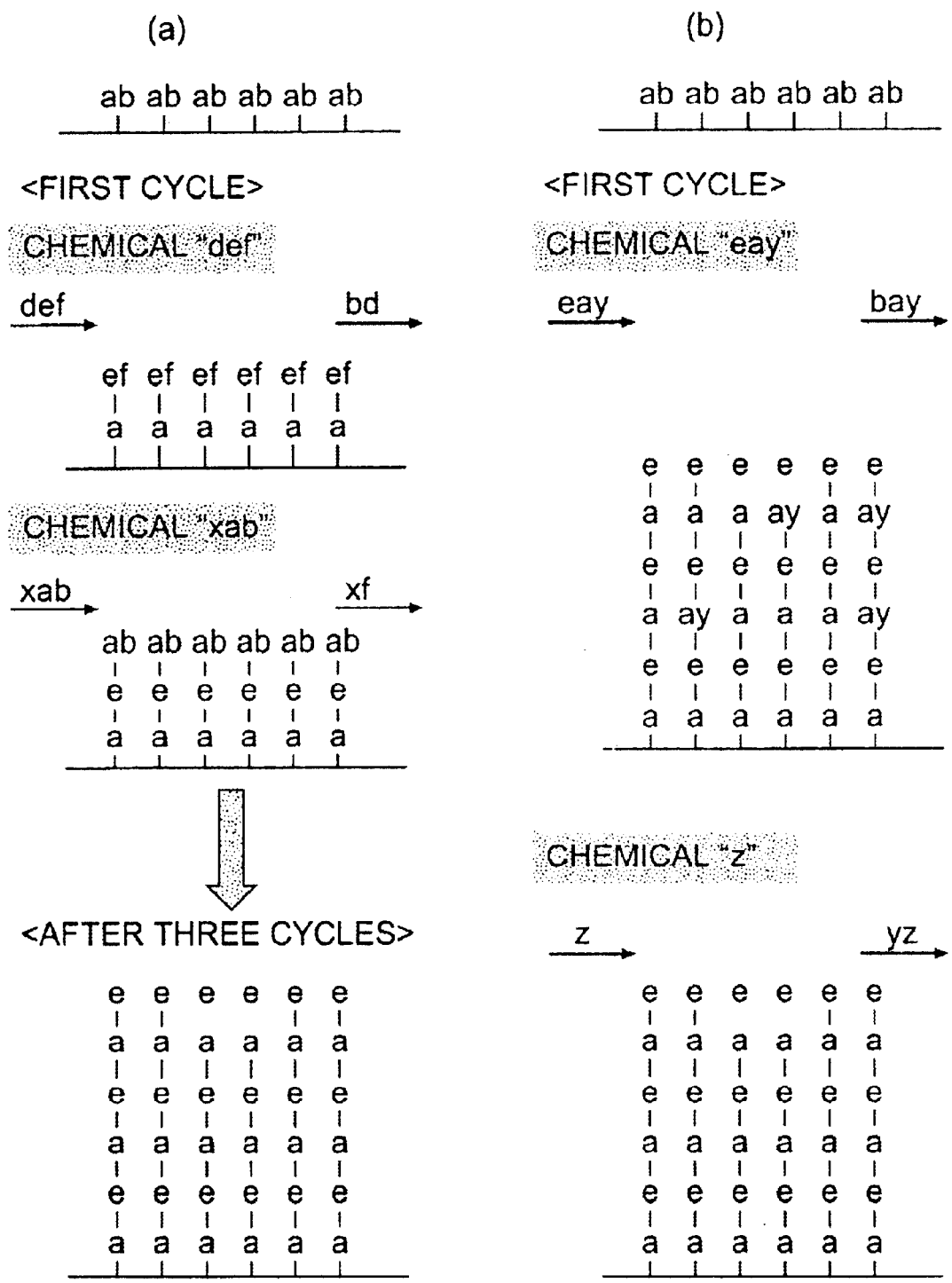
Figure 5A:
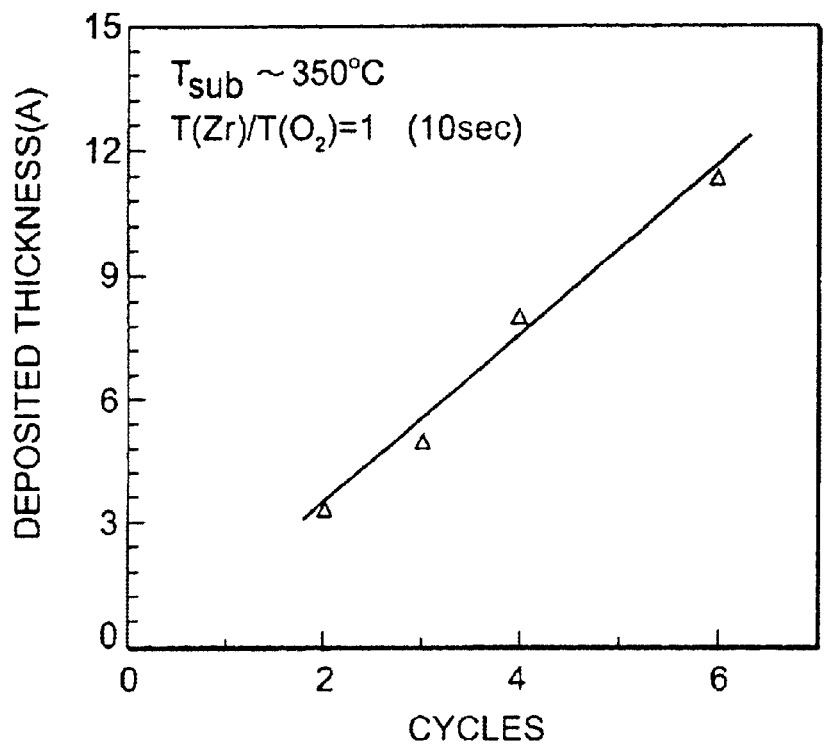
FIG. 5A is a graph of the deposited thickness versus the number of cycles.
Figure 5B:
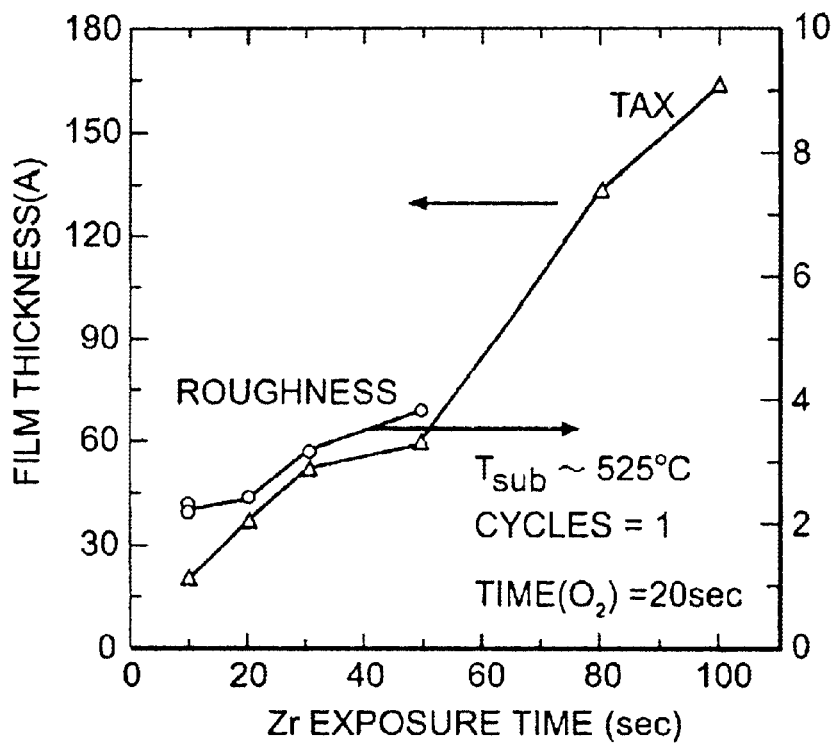
FIG. 5B is a graph of the deposited thickness versus the gas precursor time period.
Figure 5C:
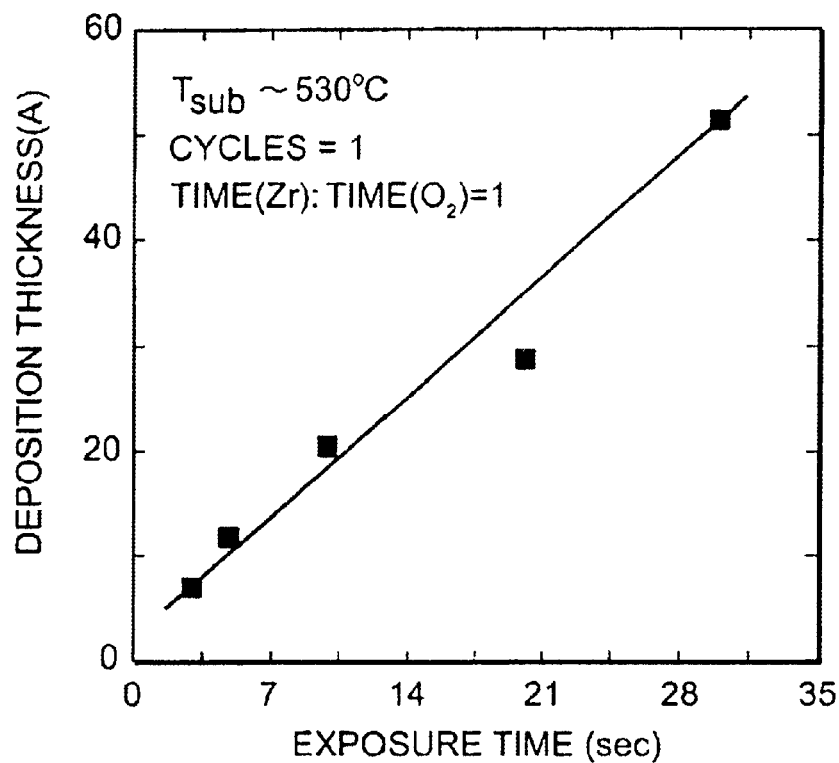
FIG. 5C is a graph of the deposited thickness versus the total time period.
Figure 5D:
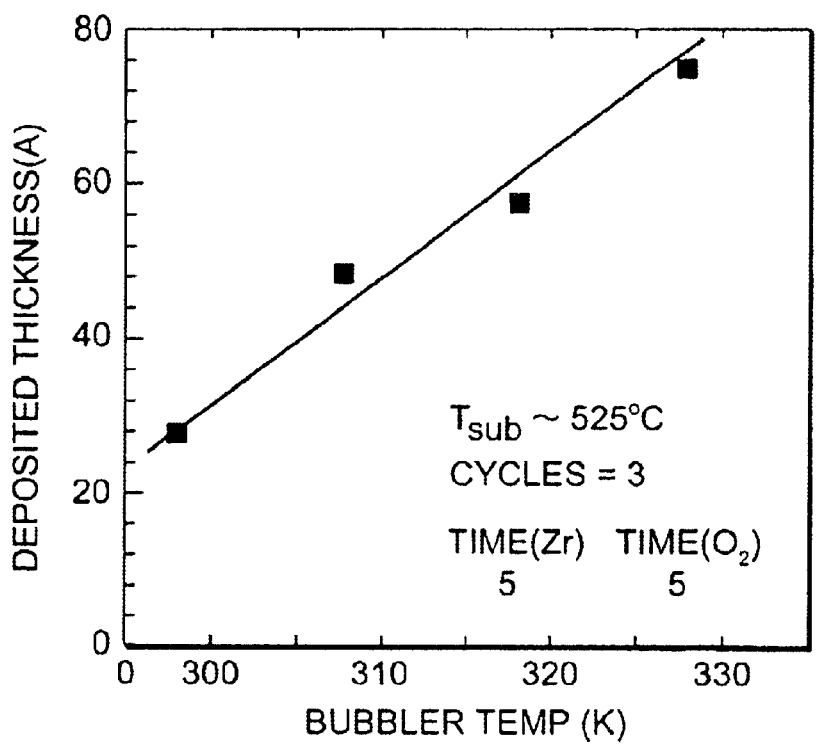
FIG. 5D is a graph of the deposited thickness versus the gas precursor vapor pressure.

In contrast to conventional techniques, as shown in FIG. 4B, the method of one embodiment of the present invention can deposit one (partial monolayer or entire monolayer) or multiple monolayers (partial monolayers or entire monolayers) after each cycle and the subsequent oxidation step serves to fully oxidize and densify the film to remove/reduce defects. The present inventors have discovered that such an oxidizing gas step, which is typically performed at a higher temperature than the precursor deposition step, can cause at least a portion of the gas molecules to diffuse through the formed oxide layers to as shown in FIG. 4B, thereby inhibiting leakage current.

Figure 6A:
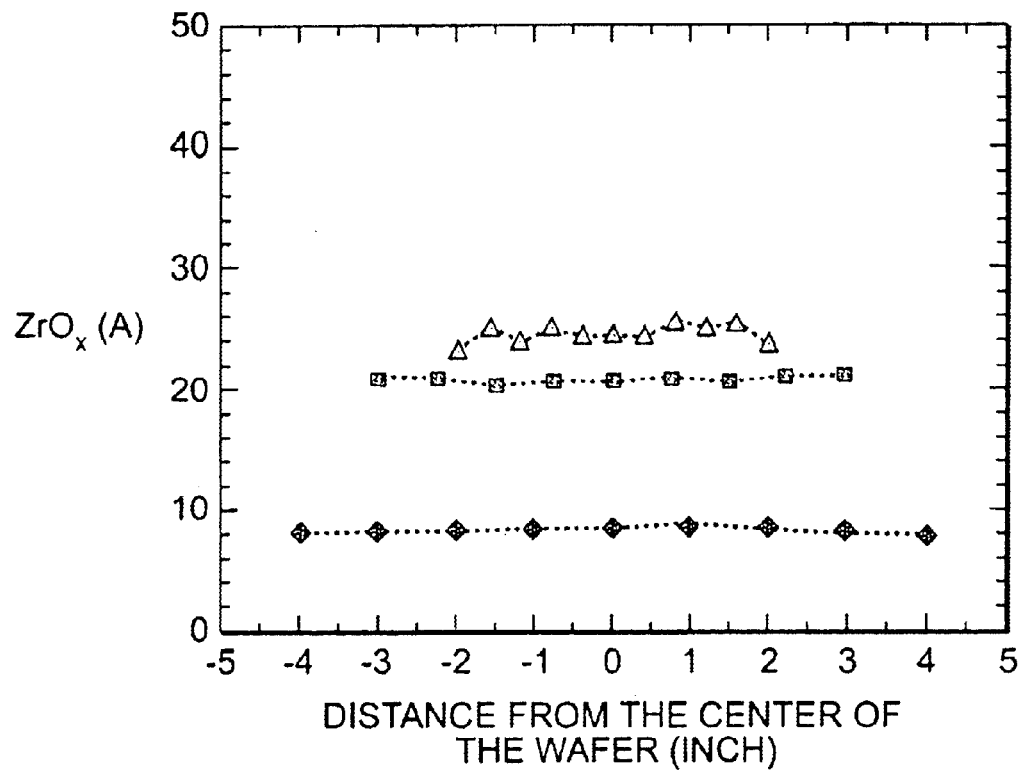
FIG. 6A is a graph of the deposited thickness at various points of the wafer versus the distance of the point from the center of the wafer.
Figure 6B:
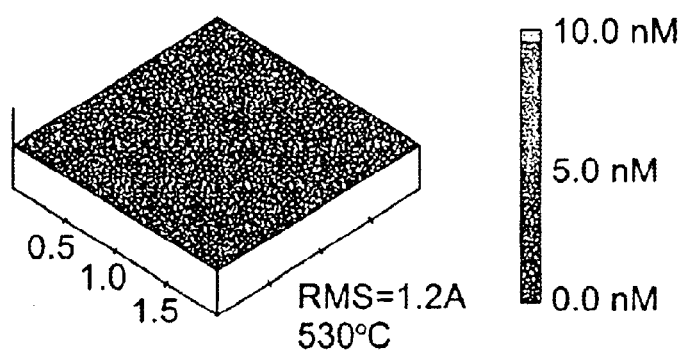
FIG. 6B is a depiction of the surface uniformity and smoothness of the wafer as determined by ellipsometry and atomic force microscopy.

Thus, as a result of the present invention, a high-k dielectric coating can be deposited onto a substrate in a more controllable and scaleable manner than conventional techniques, thereby allowing the formed coating to have reduced defects. One example of the highly scaleable process of the present invention is illustrated in FIGS. 5A–5D. As shown, the deposited film thickness scales linearly with the number of cycles, precursor exposure time, total exposure time, and the precursor vapor pressure. Moreover, the process of the present invention can also provide ultra-thin films that are highly uniform and smooth. For example, one embodiment of a uniform and smooth substrate formed according to the present invention is illustrated in FIGS. 6A–6B.

Although various embodiments of the method of the present invention have been described above, it should also be understood that other deposition and oxidizing conditions can be utilized in the method of the present invention. For instance, any set of deposition or oxidizing conditions can generally be utilized, so long as at least one of the deposition or oxidizing parameters (e.g., deposition time period, deposition temperature, gas precursor flow rate, oxidizing gas time period, oxidizing gas temperature, or oxidizing gas flow rate) varies for at least one reaction cycle.

In order to control the deposition and oxidizing gas conditions in a manner such as described above, a variety of mechanisms can be utilized. For example, in one embodiment of the present invention, as shown in FIG. 1, the system 10 can include a system controller 50 that is capable of receiving input signals from various components of the system 10 or from an operator and, based on these signals, controlling a particular parameter of the system 10. The controller 50 can be a programmable logic computer (PLC), such as an Allen-Bradley Controllogix Processor, although any other controller suitable for controlling the system 10 described above, is generally acceptable. Alternately, hardwired circuitry, relays, software, etc., could be substituted for the PLC and used as the controller 50.

For example, in one embodiment, the system controller 50 receives voltage signals from the temperature detectors 30 that represent the radiation amounts being sampled at the various locations. Based on the signals received, the controller 50 is configured to calculate the temperature of the wafer 14 at different locations. In addition, the system controller 50, as shown in FIG. 1, can also be in communication with a lamp power controller 25. In this arrangement, the controller 50 can determine the temperature of the wafer 14, and, based on this information, control the amount of thermal energy being emitted by the energy source 22. In this manner, relatively instantaneous adjustments can be made regarding the conditions within the reactor vessel 12 for processing the wafer 14 within carefully controlled limits.

For instance, as described above, the system controller 50 can be utilized in conjunction with the temperature detectors 30 and the energy source 22 to adjust the temperature within the reactor vessel 12 to a predetermined deposition or oxidizing temperature. The temperature may also be automatically adjusted after a preset deposition or oxidizing time period. Moreover, the deposition or oxidizing temperature can also be varied using the controller 50 for one or more cycles, such as described above.

The controller 50 can also be used to automatically control other components of the system 10. For instance, the controller 50 can be used to control the flow rate of gases entering the reactor vessel 12 through the gas inlet 18 (e.g., gas precursors and/or oxidizing gases). As shown, the system controller 50 can be in communication with valves 76 and 78 (e.g., solenoid valves) for controlling the flow rate of gases from the gas supplies 70 and 80, respectively. For example, in some embodiments, the controller 50 can be configured to receive temperature measurements from the temperature detectors 30. Thus, when a certain temperature is reached during a particular reaction cycle, as described above, the system controller 50 can cause the valves 76 and/or 78 to be opened to provide one or more gases to the reactive vessel 12 at a predetermined flow rate. The system controller can adjust the flow rate of the gases based on various input signals from the system 10 or from a programmer.

As a result of controlling various parameters of one or more of the reaction cycles, the present invention can achieve a variety of benefits. For instance, in contrast to conventional "atomic layer deposition" techniques, the method of the present invention has a higher yield and can sufficiently inhibit leakage current. Moreover, by providing control of the cycle parameters, the resulting dielectric coating can be more easily formed to have selected properties. For example, certain properties of the coating can be measured (e.g., thickness) during wafer processing. These properties can be instantaneously adjusted when desired by simply altering one of the cycle parameters, such as the temperature or flow rate of a gas being supplied. Moreover, some layers of the coating can be formed to have one characteristic, while other layers can be formed to have another characteristic. For example, the interfacial layers can be formed with a relatively high concentration of oxygen, thus reducing the leakage current. Therefore, in contrast to conventional deposition techniques, the method of the present invention provides control over the reaction cycle parameters so that the resulting dielectric coating can be more readily formed to have specific, predetermined properties.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A method for depositing a dielectric coating onto a substrate, the substrate being contained within a reactor vessel, said method comprising subjecting the substrate to at least two sequential reaction cycles that comprise:

i) supplying to said reactor vessel a gas precursor for a deposition time period while the substrate is at a deposition temperature of greater than about 300° C., said gas precursor having a gas precursor flow rate, said gas precursor comprising an organo-metallic compound that forms a metal oxide on said substrate; and ii) thereafter supplying to said reactor vessel an oxidizing gas for an oxidizing gas time period while the substrate is at an oxidizing gas temperature, said oxidizing gas having an oxidizing gas flow rate, wherein at least a partial monolayer of a dielectric is formed during each of said at least two sequential reaction cycles.

2. A method as defined in claim 1, wherein at least a monolayer of the dielectric is formed during at least one of said sequential reaction cycles.

3. A method as defined in claim 1, wherein said deposition temperature is greater than about 500° C. in at least one of said sequential reaction cycles.

4. A method as defined in claim 1, wherein said deposition temperature is from about 500° C. to about 900° C. in at least one of said sequential reaction cycles.

5. A method as defined in claim 1, wherein said oxidizing gas temperature is greater than about 300° C. in at least one of said sequential reaction cycles.

6. A method as defined in claim 1, wherein said oxidizing gas temperature is from about 500° C. to about 900° C. in at least one of said sequential reaction cycles.

7. A method as defined in claim 1, wherein the dielectric coating has a dielectric constant greater than about 8.

8. A method as defined in claim 1, wherein the dielectric coating has a dielectric constant from about 10 to about 80.

9. A method as defined in claim 1, wherein the dielectric coating contains a metal oxide.

10. A method as defined in claim 9, wherein said metal of said metal oxide is selected from the group consisting of aluminum, tantalum, titanium, zirconium, silicon, hafnium, yttrium, and combinations thereof.

11. A method as defined in claim 1, wherein the dielectric coating contains a metal silicate.

12. A method as defined in claim 1, wherein the substrate is a semiconductor wafer.

13. A method as defined in claim 1, wherein said oxidizing gas is selected from the group consisting of oxygen, nitric oxide, nitrous oxide, steam, and combinations thereof.

14. A method as defined in claim 1, wherein said sequential reaction cycles achieve a target thickness.

15. A method as defined in claim 1, wherein the substrate is subjected to at least three reaction cycles.

16. A method as defined in claim 1, further comprising controlling said sequential reaction cycles such that the deposition temperatures, the gas precursor flow rates, the deposition time periods, the oxidizing gas temperatures, the oxidizing gas flow rates, the oxidizing gas time periods, or combinations thereof, of at least two of said sequential reaction cycles are different.

17. A method for depositing a dielectric coating onto a semiconductor wafer, the wafer being contained within a reactor vessel, wherein an energy source is in communication with said reactor vessel for heating the wafer, said method comprising subjecting the wafer to at least two sequential reaction cycles that comprise:
   i) supplying to said reactor vessel a gas precursor for a deposition time period while the wafer is at a deposition temperature of greater than about 300° C., said gas precursor having a gas precursor flow rate, said gas precursor comprising an organo-metallic compound;
   ii) supplying to said reactor vessel an oxidizing gas for an oxidizing gas time period while the wafer is at an oxidizing gas temperature of greater than about 300° C., said oxidizing gas having an oxidizing gas flow rate, wherein at least a partial monolayer of a dielectric is formed during each of said at least two sequential reaction cycles.

18. A method as defined in claim 17, wherein at least a monolayer of the dielectric is formed during at least one of said sequential reaction cycles.

19. A method as defined in claim 17, wherein said deposition temperature is greater than about 500° C. in at least one of said sequential reaction cycles.

20. A method as defined in claim 17, wherein said deposition temperature is from about 500° C. to about 900° C. in at least one of said sequential reaction cycles.

21. A method as defined in claim 17, wherein oxidizing gas temperature is from about 500° C. to about 900° C. in at least on said sequential reaction cycles.

22. A method as defined in claim 17, wherein the dielectric coating has a dielectric constant greater than about 8.

23. A method as defined in claim 17 wherein the dielectric coating has a dielectric constant from about 10 to about 80.

24. A method as defined in claim 17, wherein the dielectric coating contains a metal oxide.

25. A method as defined in claim 24, wherein said metal of said metal oxide is selected from the group consisting of aluminum, tantalum, titanium, zirconium, silicon, hafnium, yttrium, and combinations thereof.

26. A method as defined in claim 17, wherein the wafer is subjected to at least three reaction cycles.

27. A method as defined in claim 17, further comprising controlling said sequential reaction cycles such that the deposition temperatures, the gas precursor flow rates, the deposition time periods, the oxidizing gas temperatures, the oxidizing gas flow rates, the oxidizing gas time periods, or combinations thereof, of at least of said sequential reaction cycles are different.

28. A method for depositing a dielectric coating onto a semiconductor wafer, the wafer being contained within a reactor vessel, said method comprising subjecting the wafer to at least two reaction cycles that comprise:
   a) supplying to said reactor vessel a gas precursor while the wafer is at a deposition temperature of greater than about 300° C., wherein said gas precursor comprises an organo-silicon compound so that the resulting dielectric coating comprises a metal silicate;
   b) supplying to said reactor vessel an oxidizing gas while the wafer is at an oxidizing gas temperature, wherein at least a partial monolayer of a dielectric is formed said at least two sequential reaction cycles.

29. A method as defined in claim 28, wherein at least a monolayer is formed during at least one of said sequential reaction cycles.

30. A method as defined in claim 28, wherein said deposition temperature is from about 500° C. to about 900° C. in at least one of said sequential reaction cycles.

31. A method as defined in claim 28, wherein said oxidizing gas temperature is from about 500° C. to about 900° C. in at least one of said sequential reaction cycles.

32. A method as defined in claim 28, wherein said gas precursor further comprises an inorganic silicon compound.

33. A method as defined in claim 28, wherein the dielectric coating has a dielectric constant greater than about 8.

34. A method as defined in claim 28, wherein the dielectric coating has a dielectric constant from about 10 to about 80.

35. A method as defined in claim 28, wherein said metal silicate is selected from the group consisting of zirconium silicate, hafnium silicate, and combinations thereof.

36. A method for depositing a dielectric coating, said method comprising:
   i) providing a system comprising a reactor vessel adapted to contain the semiconductor wafer and an energy source in communication with said reactor vessel for heating the semiconductor wafer contained in said vessel; and ii) subjecting the semiconductor wafer to a first reaction cycle, said first reaction cycle comprising:
   a) heating the semiconductor wafer to a first deposition temperature with said energy source, wherein said first deposition temperature is greater than about 300° C.;
   b) supplying to said reactor vessel a first gas precursor for a first deposition time period while the semiconductor wafer is at said first deposition temperature, said first gas precursor having a first gas precursor flow rate;
   c) supplying to said reactor vessel a first oxidizing gas for a first oxidizing gas time period while the semiconductor wafer is at a first oxidizing gas temperature, said first oxidizing gas having a first oxidizing gas flow rate, wherein at least a partial monolayer of a dielectric is formed during the first reaction cycle; and
iii) subjecting the semiconductor wafer to a second reaction cycle, said second reaction cycle comprising:
   a) supplying to said reactor vessel a second gas precursor for a second deposition time period while the semiconductor wafer is at a second deposition temperature, said second deposition temperature being greater than about 300° C., said second gas precursor having a second gas precursor flow rate;
   b) supplying to said reactor vessel a second oxidizing gas for a second oxidizing gas time period while the semiconductor wafer is at a second oxidizing gas temperature, said second oxidizing gas having a second oxidizing gas flow rate, wherein at least a partial monolayer of a dielectric is formed during the second reaction cycle; and
iv) optionally, subjecting the semiconductor wafer to one or more additional reaction cycles to achieve a target thickness;

wherein said first gas precursor, said second gas precursor, or combinations thereof is an organo-silicon compound so that the resulting dielectric coating contains a metal silicate, said metal silicate being selected from the group consisting of zirconium silicate, hafnium silicate, and combinations thereof.

37. A method as defined in claim 36, wherein at least a monolayer is formed during the first reaction cycle, the second action cycle, or combinations thereof.

38. A method as defined in claim 36, wherein said first deposition temperature is from about 500° C. to about 900° C.

39. A method as defined in claim 36, wherein said first oxidizing gas temperature is from about 500° C. to about 900° C.

40. A method as defined in claim 36, further comprising controlling the first reaction cycle and the second reaction cycle such that said first deposition temperature is different than said second deposition temperature, said first gas precursor flow rate is different than said second gas precursor flow rate, said first deposition time period is different than said second deposition time period, said first oxidizing gas temperature is different than said second oxidizing gas temperature, said first oxidizing gas flow rate is different than said second oxidizing gas flow rate, said first oxidizing gas time period is different than said second oxidizing gas time period, or combinations thereof.

41. A method as defined in claim 36, wherein said first gas precursor, said second gas precursor, or combinations thereof comprises an inorganic silicon compound.

42. A method as defined in claim 36, wherein the dielectric coating has a dielectric constant greater than about 8.

43. A method as defined in claim 34, wherein the dielectric coating has a dielectric constant from about 10 to about 80.

* * * * *

UNITED STATES PATENT AND TRADEMARK OFFICE
CERTIFICATE OF CORRECTION

| | |
|---|---|
| PATENT NO. | : 6,884,719 B2 |
| APPLICATION NO. | : 10/101539 |
| DATED | : April 26, 2005 |
| INVENTOR(S) | : Jane Chang et al. |

It is certified that error appears in the above-identified patent and that said Letters Patent is hereby corrected as shown below:

On the Title page Item -56-
The following references need to be added to Other Publications:

--Article – The electronic structure at the atomic scale of ultrathin gate oxides, D.A. Muller, T. Sorsch, S. Moccio, F.H. Baumann, K. Evans-Lutterodt, and G. Timp, 1999 Macmillan Magazines, Nature, Vol. 399, 06/24/99, 4 pages Article – Ultra-thin Gate Oxides Ultra-shallow Junctions for High Performance, sub-100nm pMOSFETs, G. Timp, A. Agarwal, K.K. Bourdelle, J.E. Bower, T. Boone, A. Ghetti, M. Green, J. Garno, H. Gossmann, D. Jacobson, R. Kleiman, A. Kornblit, F. Klemens, S. Moccio, M.L. O'Malley, L. Ocola, Jr. Rosamilia, J. Sapjeta, P. Silverman, T. Sorsch, W. Timp, and D. Tennant, Bell Laboratories, Lucent Technologies, 3 pages Article – On the Relationship between Stress Induced Leakage Currents and Catastrophic Breakdown in Ultra-thin SiO2 Based Dielectrics, D.A. Buchanan, J.H. Stathis, E. Cartier, and D.J. DiMaria, Elsevier Science B.V., Microelectronic Engineering 36 (1997) 329-332, 4 pages Article – Monolayer incorporation of nitrogen at Si-SiO2 interfaces: Interface characterization and electrical properties, Gerald Lucovsky, 1998 American Vacuum Society, J. Vac. Sci, Technol. A 16(1), Jan/Feb 1998, 9 pages Article – The composition of ultrathin silicon oxynitrides thermally grown in nitric oxide, E.P. Gusev, H.C. Lu, T. Gustafsson, E. Garfunkel, M.L. Green and D. Brasen, 1997 American Institute of Physics, J. App. Phys. 82 (2), 07/15/97, 3 pages Article – N depth profiles in thin SiO2 grown or processed in N2O: The role of atomic oxygen, E.C. Carr, K.A. Ellis and R.A. Buhrman, 1995 American Institute of Physics, Appl. Phys. Lett. 66 (12), 03/20/95, 3 pages Article – Effects of chemical composition on the electrical properties of NO-nitrided SiO2, M. Bhat, L.K. Han, D. Wristers, J. Yan and D.L. Kwong, 1995 American Institute of Physics, Appl. Phys, Lett. 66 (10), 03/06/95, 3 pages Article – Rapid thermal N2O oxynitride on Si(100), Z.H. Lu, R.J. Hussey, M.J. Graham, R. Cao and S.P. Tay, 1996 American Vacuum Society, J. Vac. Sci, Technol. B 14 (4), Jul/Aug 1996, 6 pages

UNITED STATES PATENT AND TRADEMARK OFFICE
CERTIFICATE OF CORRECTION

PATENT NO. : 6,884,719 B2
APPLICATION NO. : 10/101539
DATED : April 26, 2005
INVENTOR(S) : Jane Chang et al.

It is certified that error appears in the above-identified patent and that said Letters Patent is hereby corrected as shown below:

On the Title Page, Item -56-

Article – Making Silicon Nitride Film a Viable Gate Dielectric, T.P. Ma, IEEE Transactions on Electron Devices, Vol. 45, No. 3, March 1998, 11 pages Article – Tantalum pentoxide (Ta2O5) thin films for advanced dielectric applications, C. Chaneliere, J.L. Autran, R.A.B. Devine and B. Balland, Materials Science and Engineering, R22 (1998) 269-322, 54 pages Article – Nitrogen plasma annealing for low temperature Ta2O5 films, G.B. Alers, R.M. Fleming, Y.H. Wong, B. Dennis, A. Pinczuk, G. Redinbo, R. Urdahl, E. Ong, and Z. Hasan, 1998 American Institute of Physics, Applied Physics Letters, Vol. 72, Number 11, 03/16/98, 3 pages Article – A 1.1 nm Oxide Equivalent Gate Insulator Formed Using TiO2 on Nitrided Silicon, B. He, T. Ma, S.A. Campbell, and W.L. Gladfelter, 3 pages Article – Gate Quality Doped High K Films for CMOS Beyond 100 nm: 3 – 10nm Al2O3 with Low Leakage and Low Interface States, L. Manchanda, W.H. Lee, J.E. Bower, F.H. Baumann, W.L. Brown, C.J. Case, R.C. Keller, Y.O. Kim, E.J. Laskowski, M.D. Morris, R.L. Opila, P.J. Silverman, T.W. Sorsch and G.R. Weber, 1998 IEEE, 4 pages Article – Thermal stability of ultrathin ZrO2 films prepared by chemical vapor deposition on Si(100), T.S. Jeon, J.M. White, and D.L. Kwong, 2001 American Institute of Physics, Applied Physics Letter, Vol. 78, Number 3, 01/15/01, 3 pages Article – Discovery of a useful thin-film dielectric using a composition-spread approach, R.B. van Dover, L.F. Schneemeyer, and R.M. Fleming, Nature, Vol. 392, 03/12/98, 3 pages Article – Crystalline Oxides on Silicone: The First Five Monolayers, R.A. McKee, F.J. Walker, and M.F. Chisholm, 1998 The American Physical Society, Vol. 81, No. 14, 10/05/98, 4 pages Article – SrBi2Ta2O9 memory capacitor on Si with a silicon nitride buffer, Jin-Ping Han and T.P. Ma, 1998 American Institute of Physics, Applied Physics Letters, Vol. 72, No. 10, 03/09/98, 2 pages

UNITED STATES PATENT AND TRADEMARK OFFICE
CERTIFICATE OF CORRECTION

PATENT NO. : 6,884,719 B2
APPLICATION NO. : 10/101539
DATED : April 26, 2005
INVENTOR(S) : Jane Chang et al.

It is certified that error appears in the above-identified patent and that said Letters Patent is hereby corrected as shown below:

On the Title Page, Item -56-

Article – Electrical properties of hafnium silicate gate dielectrics deposited directly on silicon, G.D. Wilk and R.M. Wallace, 1999 American Institute of Physics, Applied Physics Letters, Vol. 74, No. 19, 05/10/99, 3 pages Article – Highly conformal ZrO2 deposition for dynamic random access memory application, Jane P. Chang and You-Sheng Lin, 2001 American Institute of Physics, Journal of Applied Physics, Vol. 90, No. 6, 09/15/01, 6 pages Article – Microstructure and electric properties of the PZT thin films fabricated by ECR PECVD: the effects of an interfacial layer and rapid thermal annealing, Su Ock Chung, Jae Whan Kim, Sung Tae Kim, Geun Hong Kim, and Won Jong Lee, 1998 Elsevier Science S.A., Materials Chemistry and Physics 53 (1998) 60-66, 7 pages Article – Thermodynamic stability of binary oxides in contact with silicon, K.J. Hubbard and D.G. Schlom, 1996 Materials Research Society, J. Mater Res., Vol. 11, No. 11, Nov 1996, 20 pages Article – Chemical Vapour Deposition of Undoped and Spinel-Doped Cubic Zirconia Film Using Organometallic Process, Elsevier Science Publishers B.V., Journal of Crystal Growth 74 (1986) 409-415, 7 pages Article – Effects of ion energy and arrival rate on the composition of zirconium oxide films prepared by ion-beam assisted deposition, M. Matsuoka, S. Isotani, S. Miyake, Y. Setsuhara, K. Ogata, and N. Kuratani, 1996 American Institute of Physics, J. Appl. Phys. 80 (2), 07/15/96, 5 pages Article – Model studies of dielectric thin film growth: Chemical vapor deposition of SiO2, John E. Crowell, Laura L. Tedder, Hee-Cheun Cho, Frank M. Cascarano, and Mark A. Logan, 1990 American Vacuum Society, J. Vac. Sci, Technol. A 8 (3), May/Jun 1990, 7 pages Article – ZrO2 film growth by chemical vapor deposition using zirconium tetra-tert-butoxide, M.A. Cameron and S.M. George, 1999 Elsevier Science S.A., Thin Solid Films 348 (1999) 90-98, 9 pages Article – Experimental and theoretical determination of the electronic structure and optical properties of three phases of ZrO2, R.H. French, S.J. Glass, F.S. Ohuchi, Y.-N. Xu, and W.Y Ching, 1994 The American Physical Society, Third Series, Vol. 49, No. 8, 02/15/94-II, 10 pages

UNITED STATES PATENT AND TRADEMARK OFFICE
CERTIFICATE OF CORRECTION

PATENT NO.       : 6,884,719 B2
APPLICATION NO.  : 10/101539
DATED            : April 26, 2005
INVENTOR(S)      : Jane Chang et al.

It is certified that error appears in the above-identified patent and that said Letters Patent is hereby corrected as shown below:

On the Title Page, Item -56-

Article – Pressure dependence of the refractive index of monoclinic and yttria-stabilized cubic zirconia, N.M. Balzaretti and J.A. H. da Jornada, 1995 The American Physical Society, Physical Review B, Vol. 52, No. 13, 10/01/95-I, 4 pages Technical data, JCPDS-1CDD, 1996, 23 pages Article – Volume I, Auger and X-ray Photoelectron Spectroscopy, D. Briggs and M.P. Seah, Practical Surface Analysis, Second Edition, 5 pages Article – Ultrathin zirconium oxide films as alternative gate dielectrics, J.P. Chang, Y-S. Lin, S. Berger, A. Kepten, R. Bloom, and S. Levy, 2001 American Vacuum Society, J. Vac. Sci, Technol. B 19(6), Nov/Dec 2001, 6 pages Article – Highly conformal ZrO2 deposition for dynamic random access memory application, Jane P. Chang and You-Sheng Lin, 2001 American Institute of Physics, Journal of Applied Physics, Vol. 90, No. 6, 09/15/01, 6 pages Article – An Investigation of Surface States at a Silicon/Silicon Oxide Interface Employing Metal-Oxide-Silicon Diode *, L.M. Terman, Solid-State Electronics, Pergamon Press 1962, Vol. 5, pp. 285-299, 15 pages--

Column 13, line 56 reads "precusor comprising an organo-metallic compound;" should read --precursor comprising an organo-metallic compound that forms a metal oxide on said substrate;--

Column 13, line 57 reads "ii) supplying to said reactor vessel an oxidizing gas for an" should read --ii) thereafter supplying to said reactor vessel an oxidizing gas for an--

Column 14, line 9 reads "at least or said sequential reaction cycles." should read --at least one of said sequential reaction cycles.--

UNITED STATES PATENT AND TRADEMARK OFFICE
CERTIFICATE OF CORRECTION

PATENT NO.         : 6,884,719 B2
APPLICATION NO. : 10/101539
DATED              : April 26, 2005
INVENTOR(S)       : Jane Chang et al.

It is certified that error appears in the above-identified patent and that said Letters Patent is hereby corrected as shown below:

Column 14, line 40 reads "least a partial monolayer of a dielectric is formed said" should read --least a partial monolayer of a dielectric is formed during each of said--

Signed and Sealed this

Fifth Day of June, 2007

JON W. DUDAS
*Director of the United States Patent and Trademark Office*